United States Patent
Ko

(10) Patent No.: US 9,520,346 B2
(45) Date of Patent: Dec. 13, 2016

(54) POWER SEMICONDUCTOR MODULE AND METHOD FOR MANUFACTURING THE SAME

(71) Applicant: HYUNDAI MOBIS Co., Ltd, Seoul (KR)

(72) Inventor: Jae Hyun Ko, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 14/678,105

(22) Filed: Apr. 3, 2015

(65) Prior Publication Data

US 2016/0225703 A1    Aug. 4, 2016

(30) Foreign Application Priority Data

Feb. 4, 2015   (KR) .................. 10-2015-0017338

(51) Int. Cl.
  *H01L 23/495*   (2006.01)
  *H01L 21/48*    (2006.01)

(52) U.S. Cl.
  CPC ... *H01L 23/49568* (2013.01); *H01L 23/49541* (2013.01); *H01L 23/49582* (2013.01); *H01L 23/49513* (2013.01)

(58) Field of Classification Search
  CPC ............. H01L 23/495; H01L 23/49575; H01L 23/49579; H01L 23/49582; H01L 23/49562
  See application file for complete search history.

(56) References Cited

U.S. PATENT DOCUMENTS

| 1,986,303 | A | * | 1/1935 | Swift | ........................ | B23K 9/23 |
| | | | | | | 219/137 R |
| 6,153,926 | A | * | 11/2000 | Kawamoto | ............. | H01L 21/50 |
| | | | | | | 257/676 |
| 7,528,489 | B2 | * | 5/2009 | Kajiwara | ............ | H01L 23/3107 |
| | | | | | | 257/712 |
| 2002/0192488 | A1 | * | 12/2002 | Kurihara | ............... | H01L 23/142 |
| | | | | | | 428/621 |
| 2007/0040260 | A1 | * | 2/2007 | Otremba | ................. | H01L 24/40 |
| | | | | | | 257/686 |
| 2007/0125449 | A1 | * | 6/2007 | Kajiwara | ............. | B23K 35/025 |
| | | | | | | 148/23 |
| 2008/0169538 | A1 | * | 7/2008 | Kasuya | ............... | H01L 23/3114 |
| | | | | | | 257/669 |

(Continued)

FOREIGN PATENT DOCUMENTS

JP    2011-216619 A    10/2011
KR    1999-0014614 U    5/1999

OTHER PUBLICATIONS

Nurmi, S., et al. "The effect of solder paste composition on the reliability of SnAgCu joints." Microelectronics Reliability 44.3 (2004); 485-494. (10 pages in English).

(Continued)

*Primary Examiner* — Peniel M Gumedzoe
(74) *Attorney, Agent, or Firm* — NSIP Law

(57) ABSTRACT

The present invention relates to a power semiconductor module in which heat from the semiconductor chip is radiated not only through the buffer, but also through the lead frame to increase heat radiation efficiency, and the semiconductor chip, the buffer, and the lead frame are simultaneously bonded to increase efficiency of bonding work, and a method for manufacturing the same.

7 Claims, 6 Drawing Sheets

(56) References Cited

U.S. PATENT DOCUMENTS

| | | | | |
|---|---|---|---|---|
| 2009/0202142 A1* | 8/2009 | Ishimaru | ............ | H05K 3/3442 |
| | | | | 382/150 |
| 2012/0146165 A1* | 6/2012 | Ausserlechner | ..... | G01R 15/202 |
| | | | | 257/421 |
| 2012/0248521 A1* | 10/2012 | Herbsommer | .......... | H02M 3/00 |
| | | | | 257/299 |

OTHER PUBLICATIONS

Mahmudi, R., et al. Rezaee-Bazzaz. "Impression creep behavior of lead-free Sn—5Sb solder alloy." Materials Science and Engineering: A 448.1 (2007): 287-293. (7 pages in English).

* cited by examiner

POWER SEMICONDUCTOR MODULE AND METHOD FOR MANUFACTURING THE SAME

CROSS-REFERENCE TO RELATED APPLICATIONS

This application claims priority under 35 U.S.C. §119 to Korean Patent Application No. 10-2015-0017338, filed on Feb. 4, 2015, in the Korean Intellectual Property Office, the disclosure of which is incorporated herein by reference in its entirety.

TECHNICAL FIELD

The present invention relates to a power semiconductor module and a method for manufacturing the same, and more particularly, to a power semiconductor module which may increase not only heat radiation efficiency but also efficiency of bonding work, and a method for manufacturing the same.

BACKGROUND

As a power switching unit in a driving system of a vehicle, a power semiconductor module as disclosed in Utility Model Registration No. 20-0167206 (Published on Feb. 1, 2000) is used.

That is, as illustrated in FIG. 5, a power semiconductor module A' is used in an inverter 100 of a driving system of a vehicle.

The power semiconductor module includes a semiconductor chip so that when the semiconductor chip is turned on or off, the power is switched.

In the meantime, when the semiconductor chip is repeatedly turned on and off in the power semiconductor, a considerable amount of heat is generated.

Therefore, when the heat generated from the semiconductor chip of the power semiconductor module is not evenly radiated, the power semiconductor module may be overheated, which may cause an erroneous operation.

For this reason, as illustrated in FIG. 6, below a semiconductor chip 10' of the power semiconductor module A', a direct bond copper (DBC) substrate 50 and a base plate 60 formed of copper are coupled to radiate heat generated from the semiconductor chip 10' through the DBC substrate 50 and the base plate 60.

However, a ceramic insulating layer 52 is formed between an upper foil 51 and a lower foil 53 of the DBC substrate 50 so that the heat transfer slows down by the insulating layer 52, thereby lowering the heat radiation efficiency.

Therefore, even though an improved power semiconductor module which may increase the radiation efficiency of heat generated from the semiconductor chip is suggested in the field of the present invention, the improved power semiconductor module which is suggested in the related art has a complex structure so that it is inconvenient to manufacture the power semiconductor module. Further, the improved power semiconductor module is too expensive to use.

For this reason, in the field of the present invention, it has been attempted to improve a power semiconductor module which has a simple structure, is cheap, and evenly radiates the heat generated from the semiconductor chip and a method for manufacturing the same, but satisfactory results have not been achieved yet.

SUMMARY

The present invention has been made in an effort to provide a power semiconductor module which solves a problem in that in a DBC substrate which radiates heat generated from a semiconductor chip in a power semiconductor module of the related art, a ceramic insulating layer is formed between an upper foil and a lower foil so that the heat transfer slows down due to the insulating layer, which degrades the heat radiation efficiency, and a method for manufacturing the same.

An exemplary embodiment of the present invention provides a power semiconductor module, including: a semiconductor chip which is turned on and off to switch power; a buffer which is coupled to the semiconductor chip to radiate heat emitted from the semiconductor chip; and a lead frame which is coupled to a lower portion of the buffer to supply the semiconductor chip with power from the outside, in which the buffer has a plate shape having a predetermined thickness and is formed of copper, and an upper surface thereof is bonded onto a bottom surface of the semiconductor chip by melting an upper solder, the lead frame has a plate shape having a predetermined thickness and is formed of copper, and an upper surface thereof is bonded onto a bottom surface of the buffer by melting a lower solder, and the semiconductor chip and the buffer, and the buffer and the lead frame are simultaneously bonded.

The buffer may be formed of copper and formed of non-deoxidized copper which is not plated.

A thickness of the buffer may be 4.5 to 5.5 mm.

The upper and lower solders may be formed to have a sheet or paste type.

The upper solder may be formed of a mixture of tin and antimony and 3.0 to 7.0 weight % of tin and 93.0 to 97.0 weight % of antimony may be mixed with respect to the entire mixture.

The lower solder may be formed of a mixture of tin, silver, and copper and 94.5 to 97.0 weight % of tin, 2.5 to 4.5 weight % of silver, and 0.5 to 1.0 weight % of copper may be mixed with respect to the entire mixture.

The lead frame may be formed of copper and formed of non-deoxidized copper which is not plated.

A thickness of the lead frame may be 1.0 to 2.0 mm.

Another exemplary embodiment of the present invention provides a manufacturing method of a power semiconductor module, including: a first step of preparing a buffer formed of copper and having a plate shape having a predetermined thickness; a second step of applying upper and lower solders having a sheet or paste type on an upper surface and a lower surface of the buffer; and a third step of inserting the buffer, on which the upper and lower solders are applied, into a vacuum oven to securely dispose a semiconductor chip in the upper solder on the upper surface of the buffer, and a lead frame, which is formed of copper has a plate shape having a predetermined thickness, in the lower solder on the lower surface of the buffer, and then simultaneously heating and pressing the upper solder and the semiconductor chip and the lower solder and the lead frame to bond the buffer and the semiconductor chip and the buffer and the lead frame, respectively.

In the first step, the buffer may be formed of copper and formed of non-deoxidized copper which is not plated, and a thickness thereof may be 4.5 to 5.5 mm.

In the second step, 3.0 to 7.0 weight % of tin and 93.0 to 97.0 weight % of antimony may be mixed to form an upper solder having a sheet or paste type, and 94.5 to 97.0 weight % of tin, 2.5 to 4.5 weight % of silver, and 0.5 to 1.0 weight % of copper may be mixed to form the lower solder having a sheet or paste type.

In the third step, the lead frame may be formed of copper and formed of non-deoxidized copper which is not plated, and a thickness thereof may be 1.0 to 2.0 mm.

In the third step, the vacuum oven may be heated at 230 to 250° C. thereinside.

According to the power semiconductor module and the method for manufacturing the same according to the present invention, since the lead frame which is formed of non-deoxidized copper which is not plated is bonded onto the buffer which is formed of non-deoxidized copper which is not plated, heat generated from the semiconductor chip may be radiated even through the buffer and the lead frame below the buffer so that the heat is evenly radiated, thereby increasing the heat radiation efficiency.

According to the power semiconductor module and the method for manufacturing the same according to the present invention, the semiconductor chip and the buffer and the buffer and the lead frame are simultaneously bonded, so that a time to bond the semiconductor chip, the buffer, and the lead frame may be minimized, thereby increasing the efficiency of bonding work.

DETAILED DESCRIPTION OF THE EMBODIMENTS

Hereinafter, the present invention will be described in detail with reference to the accompanying drawings.

Figure 1:
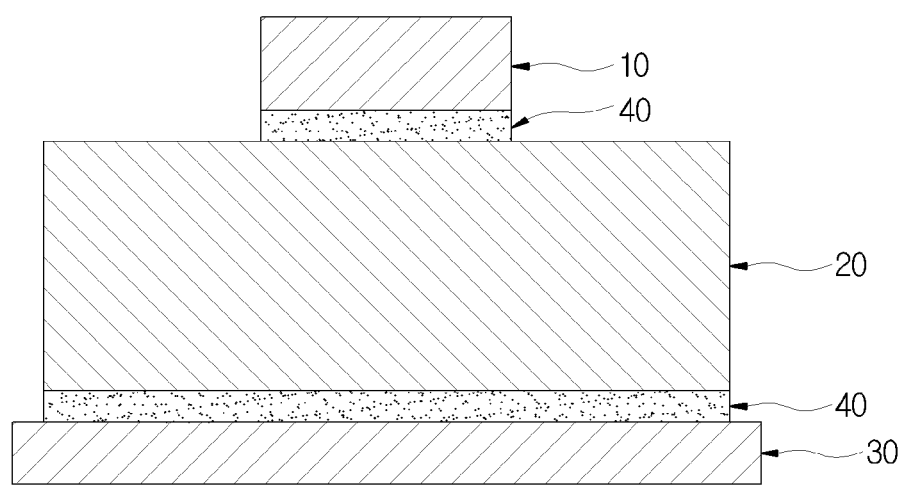
FIG. 1 is a cross-sectional view explaining a structure of a power semiconductor module according to an exemplary embodiment of the present invention.

As illustrated in FIG. 1, a power semiconductor module A according to an exemplary embodiment of the present invention includes a semiconductor chip 10, a buffer 20, and a lead frame 30.

The semiconductor chip 10 is turned on and off to switch a power.

The semiconductor chip 10 is the same as a semiconductor chip which is applied to a general power semiconductor module, so that detained description of the semiconductor chip 10 will be omitted.

The buffer 20 is coupled to the semiconductor chip 10 to radiate heat emitted from the semiconductor chip 10.

The buffer 20 may have a plate shape having a predetermined thickness.

Since the buffer 20 has a plate shape having a predetermined thickness, the heat is uniformly radiated from the entire buffer 20.

However, when the thickness of the buffer 20 is smaller than 4.5 mm, the heat is too quickly transferred so that the buffer may be damaged due to a stress. When the thickness of the buffer 20 is larger than 5.5 mm, the heat transfer may be delayed. Accordingly, the thickness of the buffer 20 may be desirably 4.5 to 5.5 mm.

The buffer 20 is formed of copper and desirably, formed of non-deoxidized copper which is not plated.

Since the buffer 20 is formed of copper and desirably formed of non-deoxidized copper which is not plated, thermal resistance is minimized due to a characteristic of the material, so that the heat is evenly radiated.

The buffer 20 is bonded onto a bottom surface of the semiconductor chip 10 by melting an upper solder 40.

That is, after applying the upper solder 40 having a sheet or paste type on the upper surface of the buffer 20, the semiconductor chip 10 is securely disposed on the upper surface of the upper solder 40, and the semiconductor chip 10 and the upper solder 40 are heated and pressed so that the buffer 20 is bonded onto the bottom surface of the semiconductor chip 10.

Here, the upper solder 40 is formed of a mixture of tin and antimony, and 3.0 to 7.0 weight % of tin and 93.0 to 97.0 weight % of antimony are mixed with respect to the entire mixture so that the thermal resistance of the upper solder 40 is minimized.

The lead frame 30 is coupled to a lower portion of the buffer 20 to supply the semiconductor chip 10 with the power from the outside.

The lead frame 30 may have a plate shape having a predetermined thickness.

Since the lead frame 30 has a plate shape having a predetermined thickness, the heat is uniformly radiated from the entire lead frame 30.

However, when the thickness of the lead frame 30 is smaller than 1.0 mm, the heat is too quickly transferred so that the lead frame may be damaged due to a stress. When the thickness of the lead frame 30 is larger than 2.0 mm, the heat transfer may be delayed. Accordingly, the thickness of the lead frame 30 may be 1.0 to 2.0 mm.

The lead frame 30 is formed of copper and desirably, formed of non-deoxidized copper which is not plated.

Since the lead frame 30 is formed of non-deoxidized copper which is not plated, thermal resistance is minimized due to a characteristic of the material so that the heat is evenly radiated.

The lead frame 30 is bonded onto the bottom surface of the buffer 20 by melting a lower solder 40.

That is, after applying the lower solder 40 having a sheet or paste type on the lower surface of the buffer 20, the lead frame 30 is securely disposed on the lower surface of the lower solder 40, and the lead frame 30 and the lower solder 40 are heated and pressed so that the lead frame 30 is bonded onto the bottom surface of the buffer 20.

Here, the lower solder 40 is formed of a mixture of tin, silver, and copper and 94.5 to 97.0 weight % of tin, 2.5 to 4.5 weight % of silver, and 0.5 to 1.0 weight % of copper are mixed with respect to the entire mixture, so that the thermal resistance of the lower solder 40 is minimized.

However, the bonding of the buffer 20 and the lead frame 30 may be performed simultaneously with the bonding of the semiconductor chip 10 and the buffer 20 as described above.

Since the bonding of the buffer 20 and the lead frame 30 is performed simultaneously with the bonding of the semiconductor chip 10 and the buffer 20, a time to bond the semiconductor chip 10, the buffer 20, and the lead frame 30 is minimized.

Figure 2:
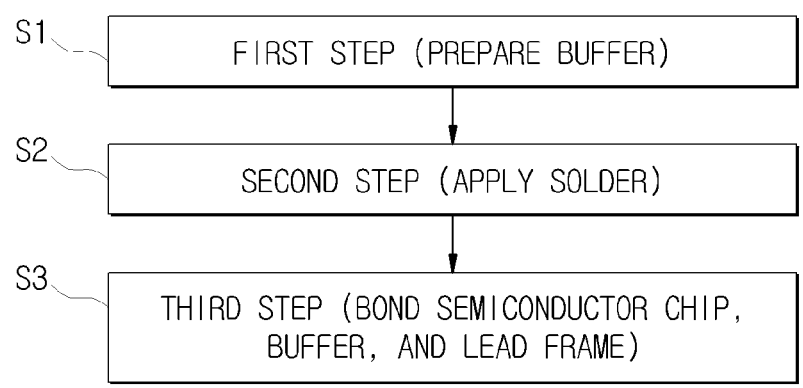
FIG. 2 is a schematic flow chart explaining a manufacturing method according to an exemplary embodiment of the present invention.

In the meantime, as illustrated in FIG. 2, a method of manufacturing a power semiconductor module according to the exemplary embodiment of the present invention includes a first step S1, a second step S2, and a third step S3.

In the first step S1, a buffer 20, which is formed of copper and has a plate shape having a predetermined thickness, is prepared.

Since the buffer 20 has been described in detail above, more detailed description will be omitted.

Figure 3:
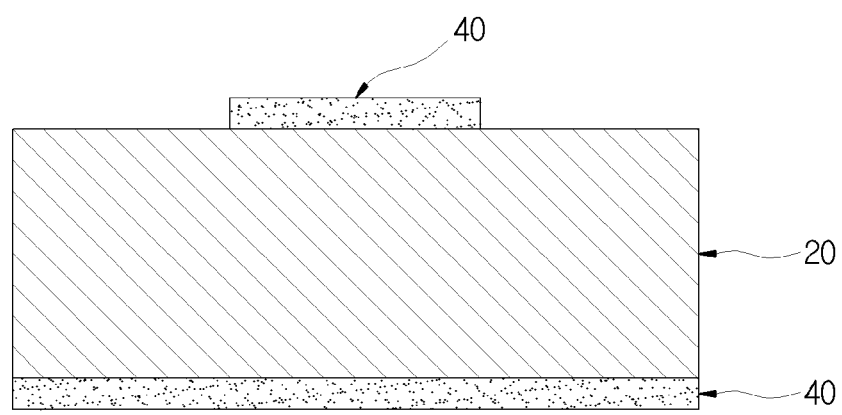
FIG. 3 is an exemplary view explaining a second step of the manufacturing method according to an exemplary embodiment of the present invention.

In the second step S2, as illustrated in FIG. 3, upper and lower solders 40 formed to have a sheet or paste type are applied onto an upper surface and a lower surface of the buffer 20.

Since the upper and lower solders 40 have been described in detail above, more detailed description will be omitted.

Figure 4:
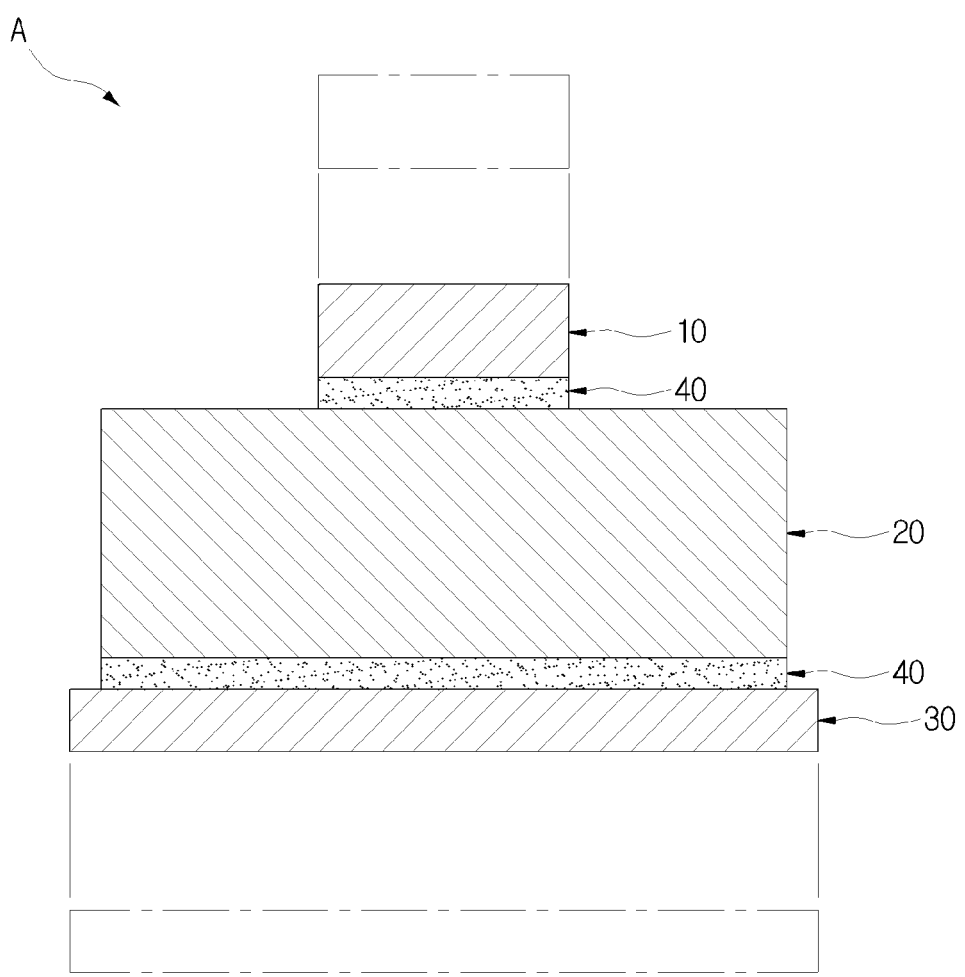
FIG. 4 is an exemplary view explaining a third step of the manufacturing method according to an exemplary embodiment of the present invention.
Figure 5:
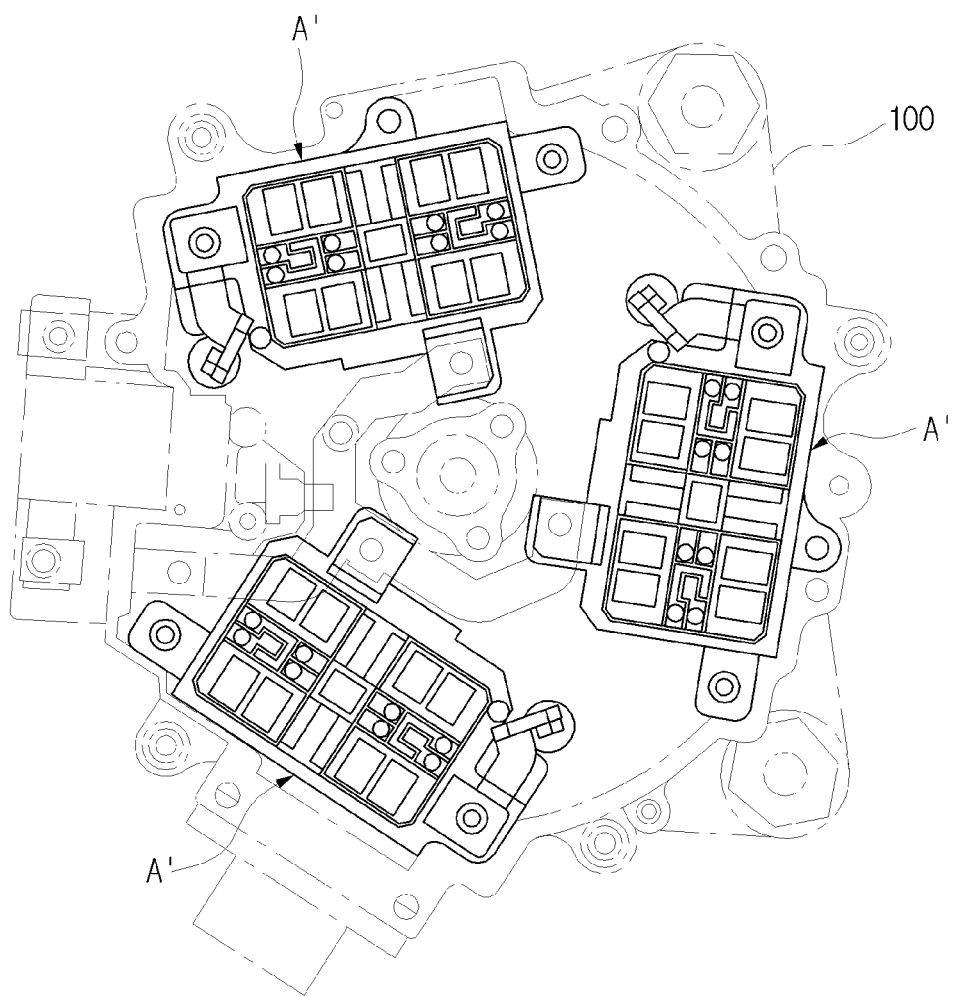
FIG. 5 is an exemplary view illustrating an example in which a general power semiconductor module is applied to an inverter.
Figure 6:
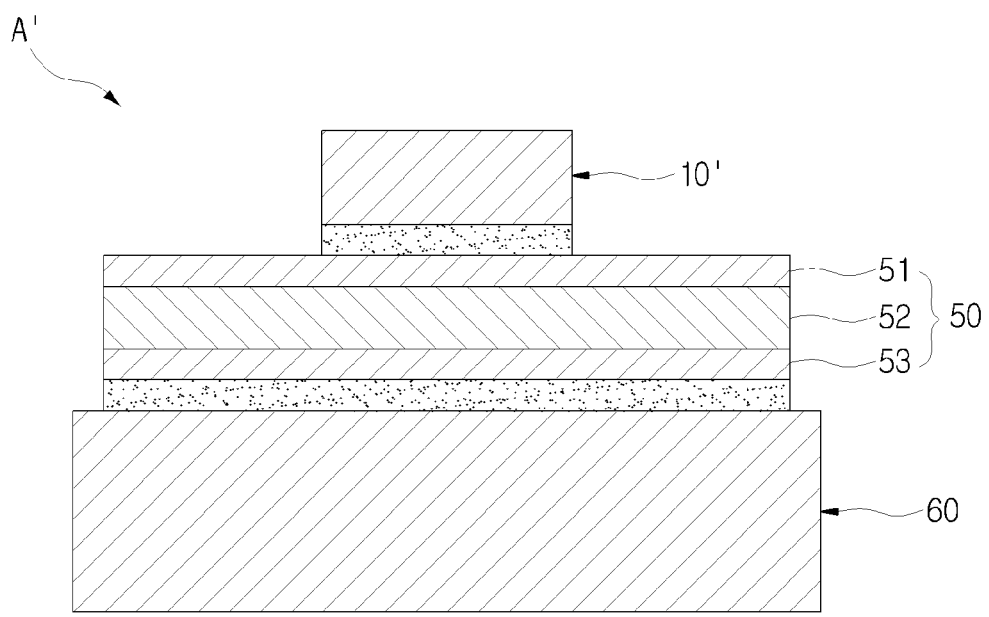
FIG. 6 is an exemplary view illustrating a structure of a power semiconductor module of the related art to which a DBC substrate is applied.

In the third step S3, as illustrated in FIG. 4, the buffer 20 on which the upper and lower solders 40 are applied, is inserted into a vacuum oven (not illustrated) to securely dispose the semiconductor chip 10 in the upper solder 40 on the upper surface of the buffer 20, and the lead frame 30, which is formed of copper and has a plate shape having a predetermined thickness, in the lower solder 40 on the lower surface of the buffer 20, and then simultaneously heat and press the upper solder and the semiconductor chip and the lower solder and the lead frame to bond the buffer and the semiconductor chip and the buffer and the lead frame.

In the third step S3, the vacuum oven is desirably heated at 230 to 250° C. thereinside.

The vacuum oven is heated at 230 to 250° C. thereinside, so that the upper and lower solders 40 are melted. Therefore, the upper and lower solders 40 are melted so that the semiconductor chip 10, the buffer 20, and the lead frame 30 are melted and bonded.

In this case, when the inside temperature of the vacuum oven does not reach 230° C., the upper and lower solders 40 are insufficiently melted and thus the semiconductor chip 10, the buffer 20, and the lead frame 30 are unstably bonded. In contrast, when the inside temperature of the vacuum oven exceeds 250°, the semiconductor 10 may be thermally damaged and thus lose unique characteristic. Therefore, the vacuum oven is desirably heated at 230 to 250° C. thereinside.

According to the power semiconductor module and the method for manufacturing the same according to the present invention, the heat radiation efficiency may be improved, which will be described in detail as follows.

In the present exemplary embodiment of the present invention, the buffer 20 is bonded to the lower portion of the semiconductor chip 10.

That is, the upper solder 40 is prepared between the semiconductor chip 10 and the buffer 20, so that when the upper solder 40 is melted, the semiconductor chip 10 and the buffer 20 are bonded to each other.

In a state when the semiconductor chip 10 and the buffer 20 are bonded, heat generated by switching the power by the semiconductor 10 is transferred to the buffer 20, so that the heat is radiated from the buffer 20.

In this case, the buffer 20 according to the exemplary embodiment of the present invention is formed of copper and desirably, formed of non-oxidized copper which is not plated. Therefore, the thermal resistance is minimized due to the characteristic of the material, so that the heat is smoothly radiated from the buffer 20.

In the exemplary embodiment of the present invention, the lead frame 30 is bonded to the lower portion of the buffer 20.

That is, the lower solder 40 is prepared between the buffer 20 and the lead frame 30, so that when the lower solder 40 is melted, the buffer 20 and the lead frame 30 are bonded to each other.

Therefore, the heat radiated from the buffer 20 is transferred to the lead frame 30, so that the heat is radiated even through the lead frame 30.

In this case, the lead frame 30 according to the exemplary embodiment of the present invention is formed of copper and desirably, formed of non-oxidized copper which is not plated. Therefore, the thermal resistance is minimized due to the characteristic of the material, so that the heat is smoothly radiated from the lead frame 30.

According to the power semiconductor module and the method for manufacturing the same according to the present invention, work efficiency for bonding the semiconductor chip 10, the buffer 20, and the lead frame 30 may be improved, which will be described in detail as follows.

In the exemplary embodiment of the present invention, the semiconductor chip 10 and the buffer 20, and the buffer 20 and the lead frame 30 are simultaneously bonded to each other.

That is, after applying the upper and lower solders 40 on the upper surface and the lower surface of the buffer 20, respectively, the buffer 20 on which the upper and lower solders 49 are applied is inserted into the vacuum oven, and the semiconductor chip 10 and the lead frame 30 are simultaneously lifted and raised from the upper portion and the lower portion of the buffer 20 to be securely disposed in the adjacent upper solder 40 and lower solder 40, respectively. The semiconductor chip 10 and the lead frame 30 which are securely disposed in the upper and lower solders 40 are simultaneously heated and pressed, so that the semiconductor chip 10 and the buffer 20, and the buffer 20 and the lead frame 30 are simultaneously bonded to each other. Therefore, a time to bond the semiconductor chip 10, the buffer 20, and the lead frame 30 is minimized, and thus work efficiency for bonding the semiconductor chip 10, the buffer 20, and the lead frame 30 is improved.

As described above, in the power semiconductor module and the method for manufacturing the same according to the exemplary embodiment of the present invention, the lead frame 30, which is formed of non-deoxidized copper which is not plated, is bonded onto the buffer 20, which is formed of non-deoxidized copper which is not plated, so that the heat generated from the semiconductor chip 10 may be radiated even through the buffer 20 and the lead frame 30 which is provided therebelow, and the heat may be smoothly radiated, thereby increasing the heat radiation efficiency. Further, since the semiconductor chip 10 and the buffer 20, and the buffer 20 and the lead frame 30 are simultaneously bonded, the time to bond the semiconductor chip 10, the buffer 20, and the lead frame 30 may be minimized, thereby increasing work efficiency for bonding the semiconductor chip 10, the buffer 20, and the lead frame 30.

The present invention as described above is not limited to the above-described exemplary embodiment so that the present invention may be modified without departing from the gist of the present invention and the modification may be embraced by the scope of the present invention defined by the claims.

What is claimed is:
1. A power semiconductor module, comprising:
a semiconductor chip;
a buffer coupled to the semiconductor chip; and
a lead frame coupled to a lower portion of the buffer, wherein the buffer comprises a plate shape and is formed of copper, and an upper surface of the buffer is bonded onto a bottom surface of the semiconductor chip by an upper solder, wherein the lead frame comprises a plate shape and is formed of copper, and an upper surface of the lead frame is bonded onto a bottom surface of the buffer by a lower solder, and wherein the upper solder comprises a mixture of 3.0 to 7.0% by weight of tin and 93.0 to 97.0% by weight of antimony, and the lower solder comprises a mixture of 94.5 to 97.0% by weight of tin, 2.5 to 4.5% by weight of silver, and 0.5 to 1.0% by weight of copper.

2. The power semiconductor module of claim 1, wherein the copper of the buffer is non-deoxidized and not plated.

3. The power semiconductor module of claim 2, wherein a thickness of the buffer is 4.5 to 5.5 mm.

4. The power semiconductor module of claim 1, wherein the upper and lower solders are of a sheet or paste type.

5. The power semiconductor module of claim 1, wherein the copper of the lead frame is non-deoxidized and not plated.

6. The power semiconductor module of claim 5, wherein a thickness of the lead frame is 1.0 to 2.0 mm.

7. The power semiconductor module of claim 1, wherein the plate shape of the lead frame is centrally located with respect to the plate shape of the buffer.

* * * * *